United States Patent [19]

Son

[11] Patent Number: 5,780,336
[45] Date of Patent: Jul. 14, 1998

[54] METHODS OF FORMING INTEGRATED CIRCUIT MEMORY DEVICES HAVING IMPROVED STORAGE ELECTRODE CONTACT REGIONS THEREIN

[75] Inventor: Jin-young Son, Kyungki-do, Rep. of Korea

[73] Assignee: Samsung Electronics Co., Ltd., Suwon, Rep. of Korea

[21] Appl. No.: 773,195

[22] Filed: Dec. 30, 1996

[30] Foreign Application Priority Data

Aug. 21, 1996 [KR] Rep. of Korea ............... 1996 34756

[51] Int. Cl.$^6$ ............................................. H01L 21/8242
[52] U.S. Cl. ........................... 438/251; 438/394; 438/254
[58] Field of Search ............ 437/919, 52; 438/238–239, 438/250–256, 381, 393–399

[56] References Cited

U.S. PATENT DOCUMENTS 4,716,126  12/1987  Cogan ......................................... 437/24
5,198,386  3/1993   Gonzalez ..................................... 437/52
5,250,832  10/1993  Murai ........................................ 257/306
5,389,558  2/1995   Suwanai et al. ............................ 437/52

*Primary Examiner*—Jey Tsai
*Attorney, Agent, or Firm*—Myers Bigel Sibley & Sajovec

[57] ABSTRACT

Methods of forming integrated circuit memory devices, such as DRAM memory cells, include the steps of performing a relatively low dose plug implantation step preferably prior to and after formation of a buried contact hole to expose a storage electrode contact region in a semiconductor substrate. By performing a plug implantation step at a low level prior to formation of a buried contact hole (and after), a memory cell having improved refresh characteristics can be achieved. In particular, the performance of the plug implantation step prior to and after formation of the buried contact hole compensates for substrate damage caused during formation of field oxide isolation regions adjacent the memory cell and during formation of the buried contact hole when the storage electrode contact region is exposed to an etchant.

10 Claims, 7 Drawing Sheets

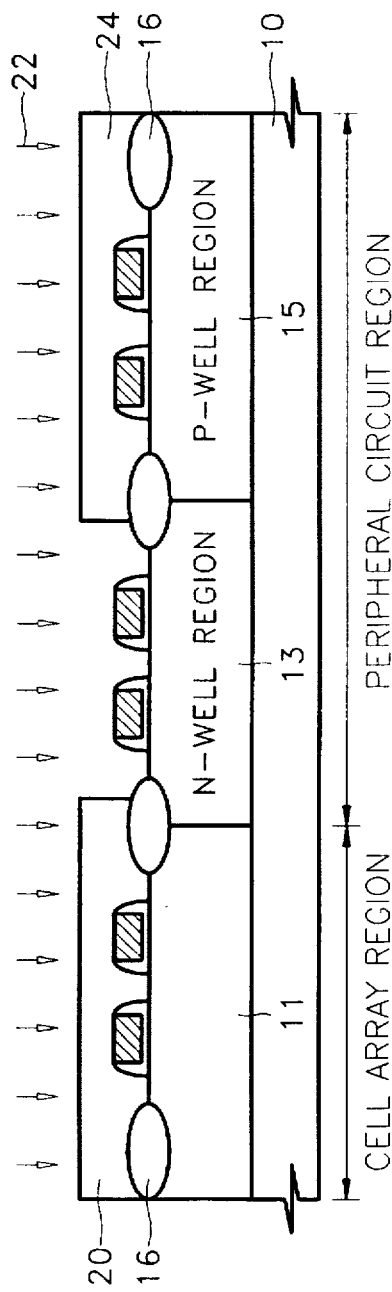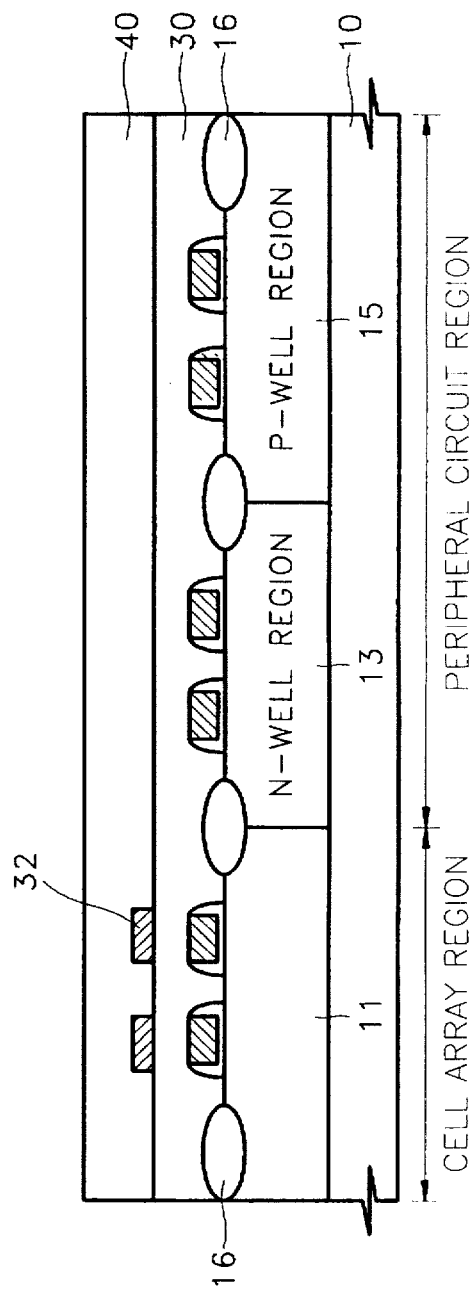

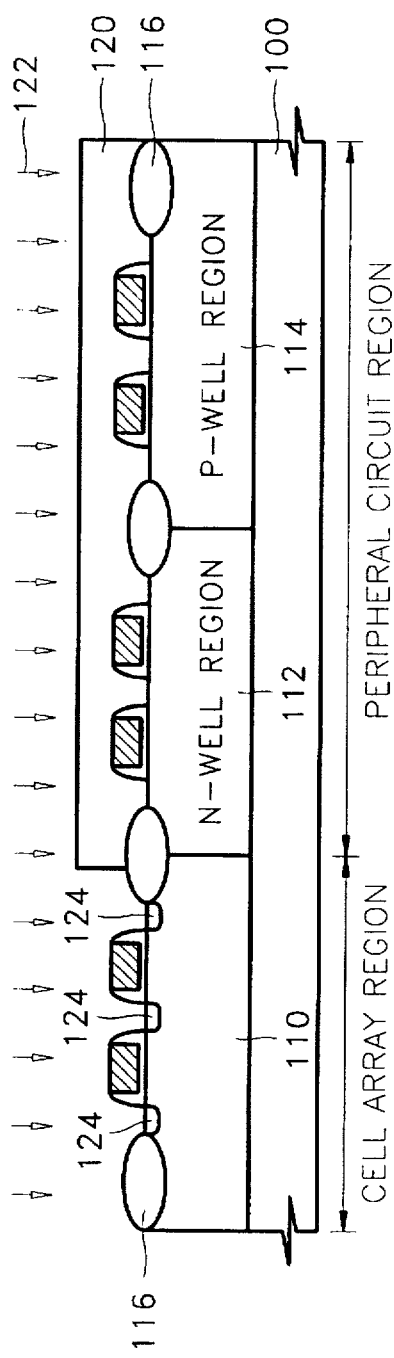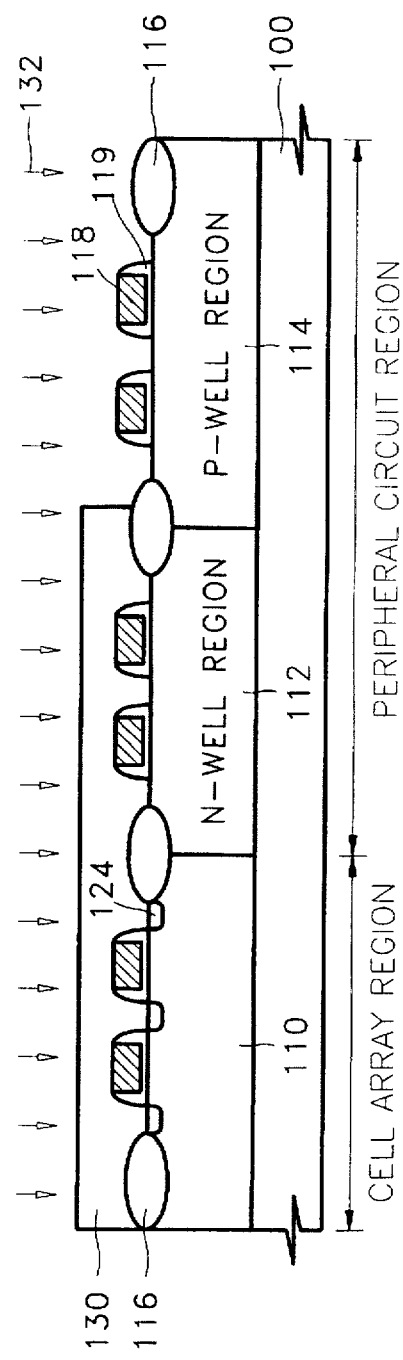

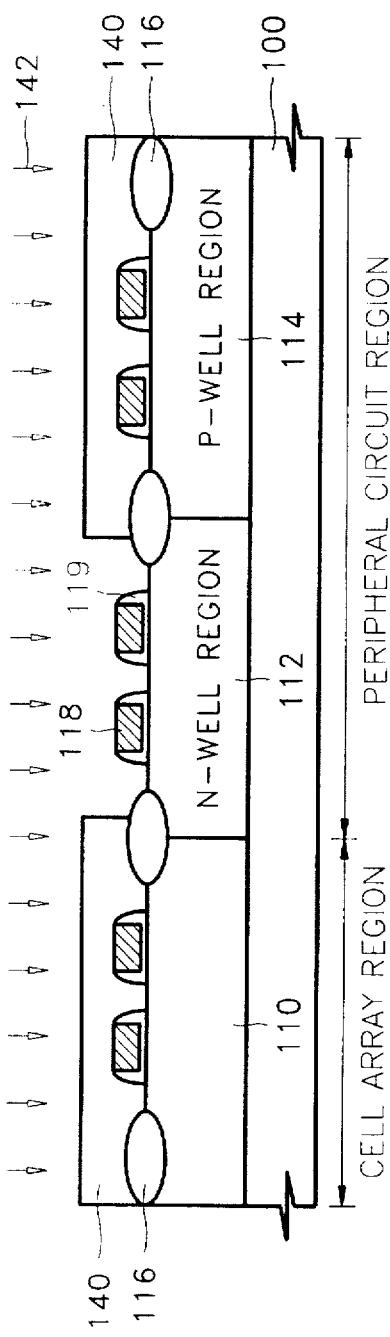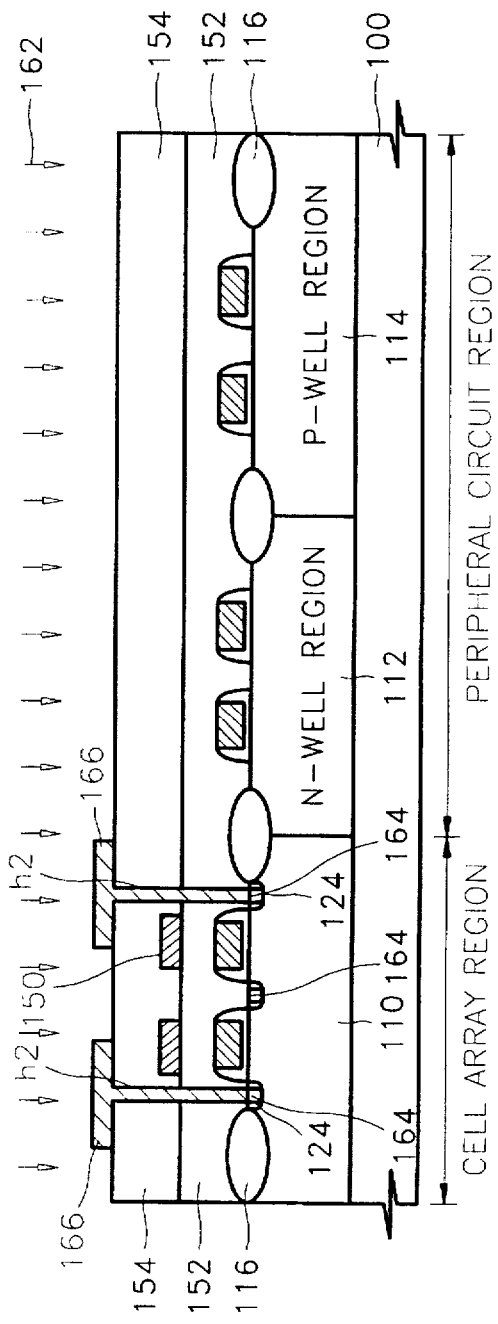

1

METHODS OF FORMING INTEGRATED CIRCUIT MEMORY DEVICES HAVING IMPROVED STORAGE ELECTRODE CONTACT REGIONS THEREIN

Field of the Invention

The present invention relates to semiconductor devices and methods of fabrication, and more particularly to methods of forming integrated circuit memory devices.

BACKGROUND OF THE INVENTION

The reduction in DRAM memory cell refresh times at high integration densities is frequently caused by, among other things, parasitic short-channel induced charge leakage from the cell's storage capacitor. To address this reduction, attempts have been made to implant plug ions into the cell's contact regions to reduce leakage currents. A method according to one such attempt is illustrated by FIGS. 1–5. Referring to FIG. 1, a cell array region 11, and an N-well region 13 and a P-well region 15 which are included in a peripheral circuit region, are formed on a first conductivity type, such as P-type, semiconductor substrate 10 using a general method. Field oxide isolation regions 16 are then formed to define active regions using a conventional technique such as local oxidation of silicon (LOCOS). Then, a gate insulation layer and conductive layer are formed on a face of the substrate to form insulated gate electrodes 18. Subsequently, in order to form lightly doped drain (LDD) regions, N– impurity ions, such as phosphorous ions, at a dosage of $2\times10^{13}/cm^2$, are implanted with 30 KeV energy using the gate electrodes 18 as a mask, thereby forming $N^{31}$ region (not shown). Then, an insulation material layer made of a high-temperature oxide is deposited on the entire surface of the resultant structure and the insulation material layer is then anisotropically etched to form spacers 19 at the sidewalls of the gate electrode 18.

Referring to FIG. 2, a mask pattern 20, through which only the P-well region is opened, is formed on the above resultant structure having spacers 19 by a photolithography process. Then, $N^{30}$ impurity ions are implanted into the entire surface of the P-well region 15 using the mask pattern 20 as an ion implantation mask, thereby forming a highly doped source/drain region (not shown) of the NMOS transistor.

Referring to FIG. 3, after removing the mask pattern 20 from the above resultant structure, a mask pattern 24 by which only the N-well region 13 is opened is formed by photolithography, and $P^{30}$ impurity ions 26 are then implanted into the entire surface of the N-well region 13 using the mask pattern 24 as an ion implantation mask, thereby forming a highly doped source/drain region (not shown) of the PMOS transistor. Thereafter, a thermal process is performed with respect to the above resultant structure to activate the implanted ions.

Referring to FIG. 4, after removing the mask pattern 24 from the resultant structure of FIG. 3, a first inter-level insulation layer 30 is formed and then a bit line 32 is formed on the first inter-level insulation layer 30. Then, a second insulation layer 40 is formed thereon. Referring to FIG. 5, in order to form a buried contact which electrically contacts a storage capacitor to be formed by a later process and an active region of the semiconductor substrate 10, the second inter-level insulation layer 40 and the first inter-level insulation layer 30 are etched in sequence using photolithography to form first and second inter-level insulation layer patterns 34 and 42 including contact holes hi which partially expose the active region of the semiconductor substrate 10. Then, a plug ion implantation step is performed on the entire surface of the resultant structure using a predetermined impurity ion 50, thereby forming a plug ion implantation region 54 in the semiconductor substrate 10 exposed by the contact holes hi.

According to the above conventional method, the plug ion implantation step is performed after formation of the contact hole so that damage which may occur during the etching process for forming the contact hole can be repaired. Thus, leakage current in the cell array region can be reduced and the refresh time interval associated with the memory cell can be increased to some extent.

However, because the plug ion implantation region 54 is limited to the buried contact region, it is impossible for the plug ion implantation region to sufficiently include the region stressed during the formation of the field isolation regions 16. Thus, notwithstanding the above described method of forming DRAM memory cells, there continues to be a need for improved methods of forming integrated circuit memory devices containing memory cells therein.

SUMMARY OF THE INVENTION

It is therefore an object of the present invention to provide improved methods of forming integrated circuit memory devices.

It is another object of the present invention to provide methods of forming integrated circuit memory devices having improved memory refresh characteristics.

These and other objects, features and advantages of the present invention are provided by methods of forming integrated circuit memory devices, such as DRAM memory cells, which include the steps of performing a relatively low dose plug implantation step preferably prior to and after formation of a buried contact hole to expose a storage electrode contact region in a semiconductor substrate. By performing a plug implantation step at a low level prior to formation of a buried contact hole, a memory cell having improved refresh characteristics can be achieved. In particular, the performance of the plug implantation step prior to formation of the buried contact hole compensates for substrate damage caused during formation of field oxide isolation regions adjacent the memory cell and during formation of the buried contact hole when the storage electrode contact region is exposed to an etchant.

In particular, a preferred method includes the steps of forming a field oxide isolation region at a face of a semiconductor substrate and then forming an insulated electrode of a DRAM memory cell on the face, adjacent the field oxide isolation region. Dopants of first conductivity type are then implanted into the face, using the insulated electrode as an implant mask, to define a storage electrode contact region of first conductivity type between the insulated electrode and field oxide isolation region. Sidewall spacers are also formed on the first and second opposing edges of the insulated electrode and then dopants of first conductivity type are implanted into the storage electrode contact region at a dose level in a range between about $1\times10^{12}$ $cm^{-2}$ and $3\times10^{13}$ $cm^{-2}$ and at an energy in a range between about 10 KeV and 300 KeV, using the insulated electrode and sidewall spacers as an implant mask. An electrode of a storage capacitor is then coupled to the storage electrode contact region by patterning metallization in a contact hole exposing the storage electrode contact region. Prior to forming the electrode of the storage capacitor, dopants of first conductivity type are preferably implanted through the contact hole and into the storage electrode contact region at a dose level in a range between about $1 \times 10^{12}$ cm$^{-2}$ and $3 \times 10^{13}$ cm$^{-2}$ and at an energy in a range between about 10 KeV and 300 KeV.

BRIEF DESCRIPTION OF THE DRAWINGS

FIGS. 1-5 illustrate schematic cross-sectional views of intermediate structures illustrating a method of forming an integrated circuit memory device according to the prior art.

FIGS. 6-10 illustrate schematic cross-sectional views of intermediate structures illustrating a method of forming an integrated circuit memory device according to an embodiment of the present invention.

Description of Preferred Embodiments

Figure 1:
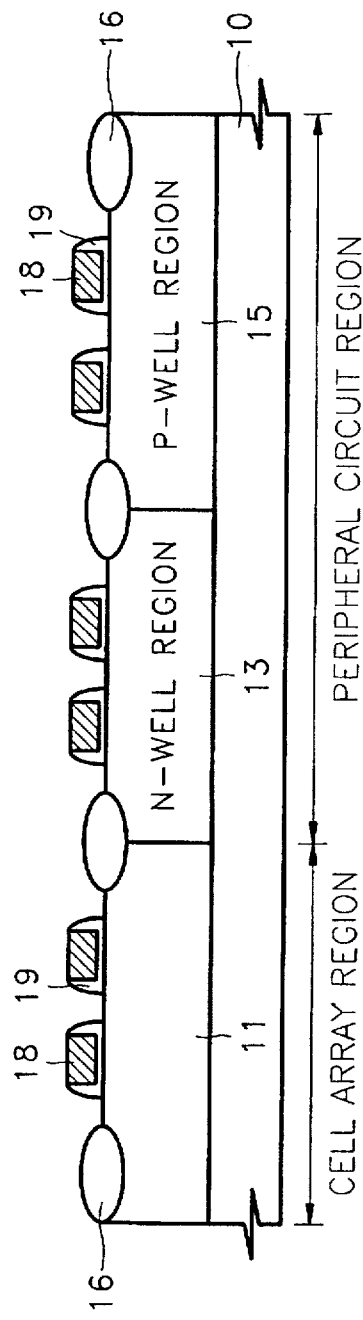
Figure 2:
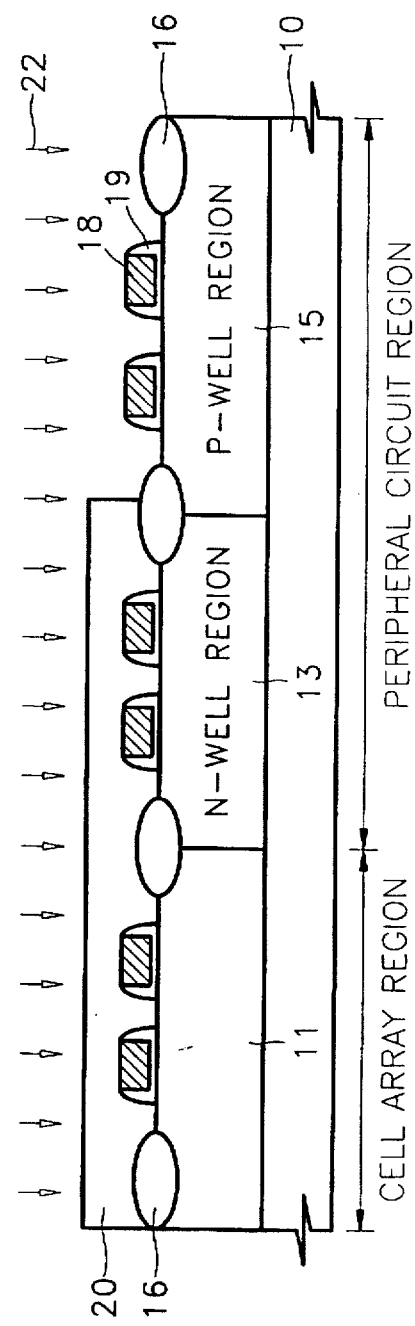
Figure 5:
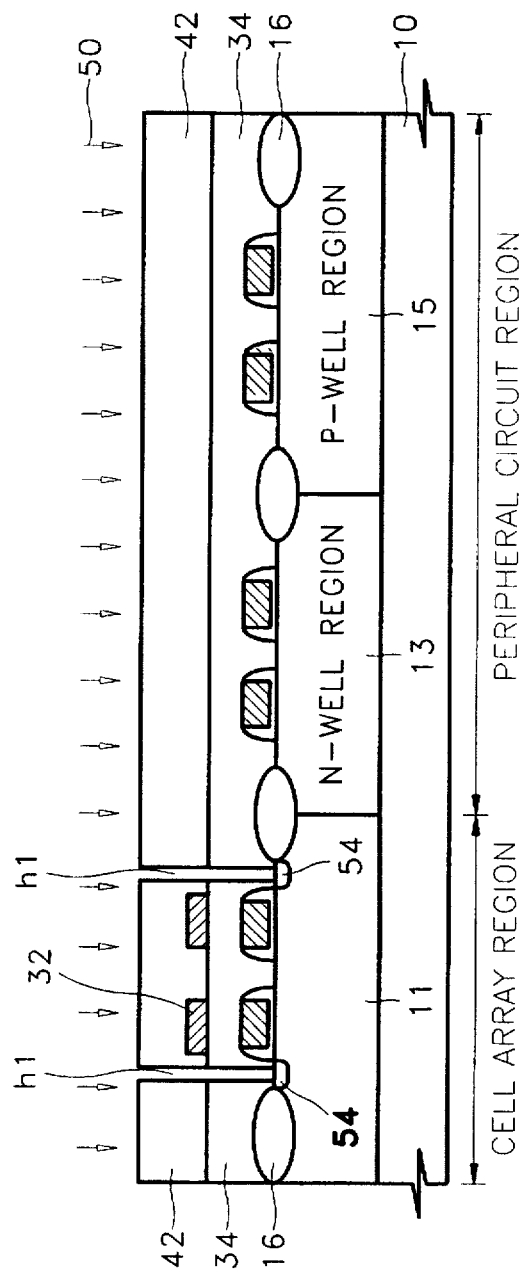

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well.

Figure 6:
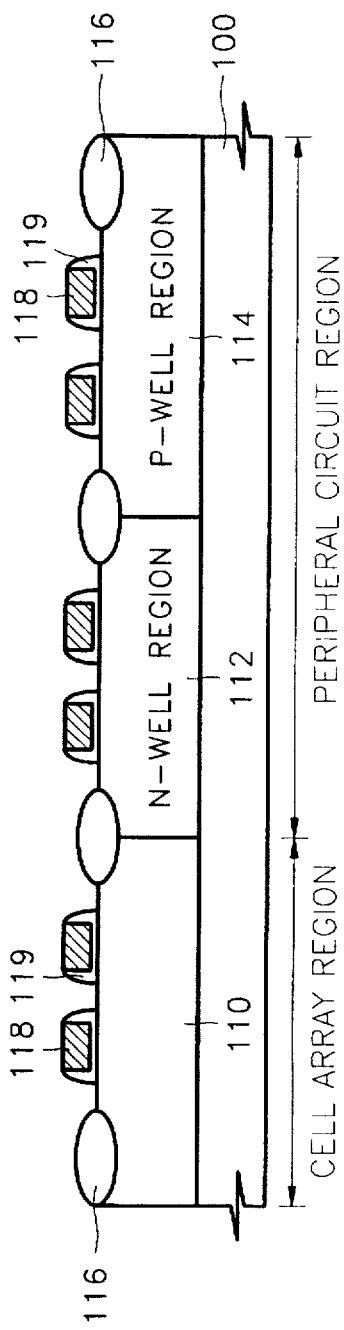

Referring now to FIGS. 6-12, preferred embodiments of the present invention will now be described. In particular, FIG. 6 illustrates the steps of forming a plurality of insulated electrodes 118 having sidewall spacers 119 on a face of a semiconductor substrate 100 containing a memory cell array region 110 therein in which memory devices are formed and a peripheral circuit portion in which PMOS and NMOS transistors for driving and controlling the memory devices are formed in respective N-well and P-well regions 112 and 114. As illustrated, a plurality of field oxide isolation regions 116 can be formed at a face of the substrate 100 (e.g., P-type) to define active regions, using such conventional techniques as local oxidation of silicon (LOCOS). Then, an electrode insulating layer (e.g., SiO$_2$) can be formed on exposed portions of the substrate using a thermal oxidation step. A conductive layer, such as a polycrystalline conductive layer, can then be deposited and patterned to define a plurality of insulated electrodes 118. Lightly doped source and drain regions (LDD) can also be formed by implanting dopants (e.g., phosphorus) at low dose levels (e.g., $2 \times 10^{13}$ cm$^{-2}$) and low energies (e.g., 30 KeV) using the insulated gate electrodes 118 as an implant mask. A blanket layer of insulation material, such as a high-temperature oxide, can then be deposited and anisotropically etched to form sidewall spacers 119 at the sidewalls of the insulated electrodes 118.

Referring now to FIG. 7, dopants 122 (e.g., plug ions) of predetermined conductivity type are then implanted in the cell array region 110 using the insulated electrodes 118 and sidewall spacers 119 as an implant mask. Here, the peripheral circuit portion of the substrate may be covered by patterning a mask 120 to expose only the cell array region 110 and then phosphorus ions may be selectively implanted at a relatively low dose level in a range between about $1 \times 10^{12}$ cm$^{-2}$ and $3 \times 10^{13}$ cm$^{-2}$ and at an energy in a range between about 10 KeV and 300 KeV. These dopants are preferably implanted into the cell array region 110 to form storage electrode and bit line contact regions 124 for DRAM memory cells, for example, and compensate for some the stress-induced defects generated in the substrate during formation of the field oxide isolation regions 116. Alternatively, the above implantation step may be performed as a blanket implantation step without the formation of the mask 120.

Referring now to FIG. 8, another mask 130 is patterned to expose the P-well region 114 and then a relatively high dose implantation step is performed to form the source and drain regions (not shown) of a plurality of NMOS transistors. Here, N-type dopants 132 such as phosphorus, for example, may be selectively implanted into the P-well region 114. Similarly, as illustrated best by FIG. 9, a mask 140 is patterned to expose the N-well region 112 and then P-type dopants 142 are selectively implanted into the N-well region 112 to form highly doped source and drain regions (not shown) of a plurality of PMOS transistors. Thereafter, a thermal process is performed to activate the implanted dopants and anneal defects in the substrate 100.

Referring now to FIG. 10, a blanket first inter-layer insulating layer 152 (e.g., SiO$_2$) is then formed on the substrate using conventional techniques. Bit lines 150 to the memory cells are then patterned. Although not shown, these bit lines 150 may be coupled to one or more of the storage electrode and bit line contact regions 124. A blanket second insulating layer 154 (e.g., SiO$_2$) is then formed on the bit lines 150 and first inter-layer insulating layer 152. Thereafter, the insulating layers are selectively etched using a mask (not shown) to form contact holes h2 which expose the storage electrode contact regions 124. Dopants, such as phosphorus ions 162, are then implanted through the contact holes h2 and into the storage electrode contact regions 124 to further compensate for stress related defects and also ameliorate damage which may have occurred when the contact regions 124 were exposed to the etchant used to form the contact holes h2. To prevent incurring further implant damage, the ions 162 are preferably implanted at a low dose level in a range between about $1 \times 10^{12}$ cm$^{-2}$ and $3 \times 10^{3}$ cm$^{-2}$ and at an energy in a range between about 10 KeV and 300 KeV, to form final storage electrode contact regions 164. An electrode 166 of a storage capacitor can then be formed by patterning metallization in the contact holes h2 using conventional techniques.

Figure 11:
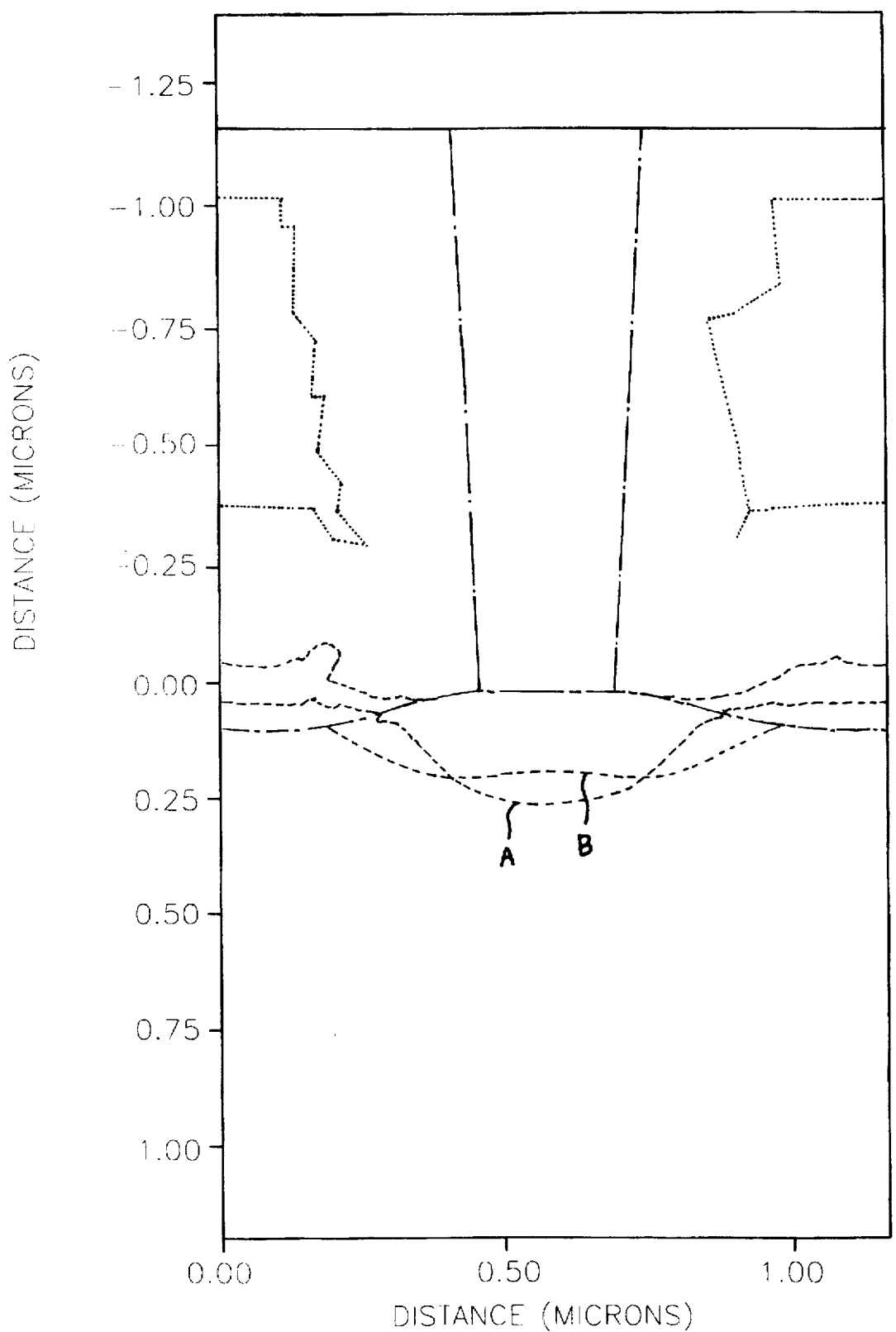
FIG. 11 is a cross-sectional view illustrating the dopant profiles in a storage electrode contact region formed in accordance with the prior art and the present invention.

FIG. 11 shows profiles of the plug ion implantation regions which are formed by the conventional and present plug ion implantation methods, respectively. Here, reference characteristic A represents the profile by the conventional method and reference characteristic B represents the profile by the method according to the present invention. As shown in FIG. 11, when the plug ion implantation is performed by the present method (B), in which the plug ion implantation is performed in the cell array region after the spacers are formed at the sidewalls of the gate electrode of the memory cell prior to the formation of the inter-level insulation layer coating the cell, the plug ion implantation region is formed over a wider range compared with that formed by the conventional method (A) in which the plug ion implantation is performed after the buried contact hole is formed. Thus, the plug ion implantation region formed by the present method includes more of the regions stressed by the formation of an isolation regions 116 layer, so that the electrical (i.e., refresh) characteristics of the memory device can be improved.

Also, as described in the above embodiment, the plug ion implantation process may be performed after the highly doped source/drain regions of the NMOS transistor or PMOS transistor are formed, as well as prior to the formation of the highly doped source/drain regions of the NMOS and PMOS transistors. Also, since the length of the spacers formed at the sidewalls of the gate electrode and the thickness of a field oxide are gradually reduced by washing processes which are repeatedly performed between each process step, the range of the plug ion implantation region formed in the cell array region changes depending on when the plug ion implantation is performed. Thus, the range of plug ion implantation with respect to the cell array region can be controlled according to the characteristics of the desired semiconductor device.

Figure 12:
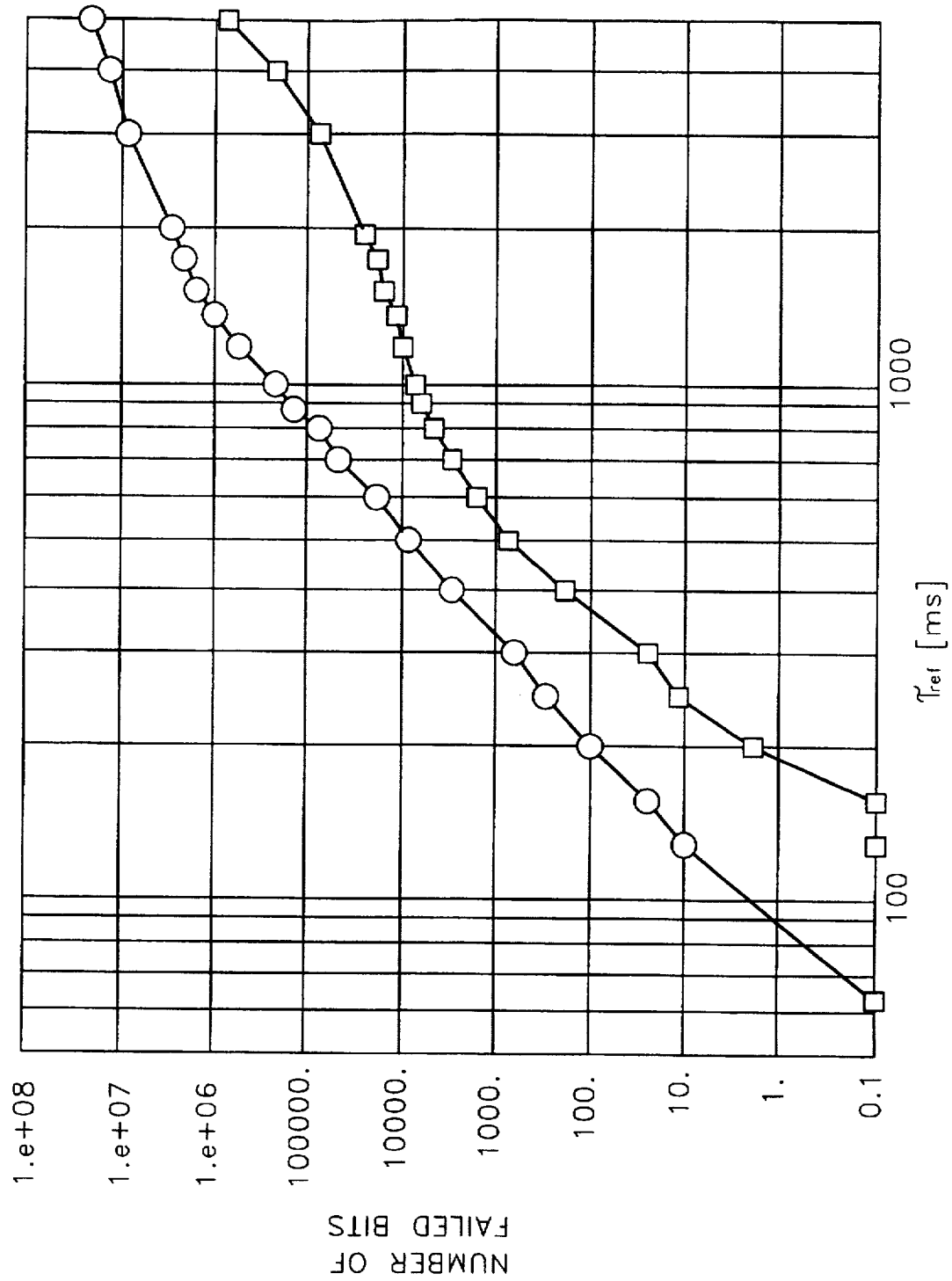
FIG. 12 is graph illustrating a comparison between the refresh characteristics of a DRAM memory cell formed in accordance with the prior art and the present invention.

FIG. 12 is a graph showing the refresh characteristics when plug ion implantation is performed by the method according to the prior art and the method of the present invention. Here, the graph represented by circles designates the refresh characteristics of a device formed by the present invention and the graph represented by squares designates the refresh characteristics of a device formed by the conventional method. In order to evaluate the refresh characteristics of a device by the present invention, the first plug ion implantation step was performed in the cell array region after the spacers were formed at the sidewalls of the gate electrode of the memory cell, but prior to the formation of the inter-level insulation layer, and then the second plug ion implantation step was performed in the contact hole for forming the buried contact between the capacitor and the active region of the semiconductor substrate. On the other hand, the plug ion implantation step was performed only in the contact hole for forming the buried contact hole between the capacitor and the active region of the semiconductor substrate according to the conventional method. Then, the refresh characteristic was evaluated as the number of failed bits by a refresh time interval ($T_{ref}$).

As can be seen from FIG. 12, when the plug ion implantation is performed by the semiconductor fabricating method of the present invention, the refresh characteristics are improved compared with that by the conventional method. According to the semiconductor device fabrication method of the present invention, the range of the plug ion implantation region in the semiconductor substrate can be freely controlled and the refresh characteristics of the semiconductor device can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:
    forming a field oxide isolation region at a face of semiconductor substrate;
    forming an insulated electrode of a memory cell on the face, adjacent the field oxide isolation region;
    implanting dopants of first conductivity type into the face using the insulated electrode as an implant mask to define a storage electrode contact region of first conductivity type between the insulated electrode and the field oxide isolation region; then
    forming sidewall spacers on first and second opposing edges of the insulated electrode;
    implanting dopants of first conductivity type into the storage electrode contact region at a dose level in a range between about $1\times10^{12}$ cm$^{-2}$ and $3\times10^{13}$ cm$^{-2}$ and at an energy in a range between about 10 KeV and 300 KeV, using the insulated electrode and sidewall spacers as an implant mask; and
    forming an electrode of a storage capacitor coupled to the storage electrode contact region, on the substrate.

2. The method of claim 1, further comprising the steps of:
    forming a first electrically insulating layer on the field oxide isolation region, sidewall spacers and insulated electrode;
    patterning a bit line on the first electrically insulating layer;
    forming a second electrically insulating layer on the first electrically insulating layer and the bit line;
    forming a contact hole in the first and second electrically insulating layers to expose the storage electrode contact region; and
    implanting dopants of first conductivity type through the contact hole and into the storage electrode contact region.

3. The method of claim 2, wherein said step of forming an electrode of a storage capacitor comprises patterning a layer of metallization in the contact hole.

4. The method of claim 2, wherein said step of implanting dopants of first conductivity type through the contact hole comprises implanting dopants of first conductivity type at a dose level in a range between about $1\times10^{12}$ cm$^{-2}$ and $3\times10^{13}$ cm$^{-2}$ and at an energy in a range between about 10 KeV and 300 KeV.

5. The method of claim 3, wherein said step of implanting dopants of first conductivity type through the contact hole comprises implanting dopants of first conductivity type at a dose level in a range between about $1\times10^{12}$ cm$^{-2}$ and $3\times10^{13}$ cm$^{-2}$ and at an energy in a range between about 10 KeV and 300 KeV.

6. A method of forming an integrated circuit memory device, comprising the steps of:
    forming a semiconductor substrate containing a memory cell array region of first conductivity type therein extending to a face thereof at a first location and a peripheral circuit region of first conductivity type therein extending to the face at a second location spaced from the first location;
    forming an insulated electrode of a memory cell on the memory cell array region and an insulated electrode of a field effect transistor on the peripheral circuit region;
    forming sidewall spacers on sidewalls of the insulated electrode of the memory cell and on sidewalls of the insulated electrode of the field effect transistor;
    implanting dopants of second conductivity type in the memory cell array region at a first dose level using the insulated electrode of the memory cell and respective sidewall spacers as an implant mask to define a storage electrode contact region;
    implanting dopants of second conductivity type in the peripheral circuit region at a second dose level, greater than the first dose level, using the insulated electrode of the field effect transistor and respective sidewall spacers as an implant mask to define source and drain regions;
    forming a first electrically insulating layer on the insulated electrode of the memory cell;

forming a contact hole in the first electrically insulating layer to expose the storage electrode contact region;

implanting dopants of second conductivity type through the contact hole and into the storage electrode contact region;

forming an electrode of a storage capacitor coupled to the storage electrode contact region, on the first electrically insulating layer; and wherein said step of implanting dopants of second conductivity type through the contact hole comprises implanting phosphorus at a dose level in a range between about $1\times10^{12}$ cm$^{-2}$ and $3\times10^{13}$ cm$^{-2}$ and at an energy in a range between about 10 KeV and 300 KeV.

7. The method of claim 6, wherein said step of implanting dopants of second conductivity type to define a storage electrode contact region comprises implanting dopants of second conductivity type at a dose level in a range between about $1\times10^{12}$ cm$^{-2}$ and $3\times10^{13}$ cm$^{-2}$ and at an energy in a range between about 10 KeV and 300 KeV.

8. The method of claim 7, wherein said step of forming a contact hole is preceded by the steps of:

patterning a bit line of the first electrically insulating layer; and forming a second electrically insulating layer on the first electrically insulating layer and the bit line.

9. The method of claim 8, wherein said step of implanting dopants of second conductivity type through the contact hole comprises implanting phosphorus at a dose level in a range between about $1\times10^{12}$ cm$^{-2}$ and $3\times10^{13}$cm$^{-2}$ and at an energy in a range between about 10 KeV and 300 KeV.

10. The method of claim 7, wherein said step of implanting dopants of second conductivity type through the contact hole comprises implanting phosphorus at a dose level in a range between about $1\times10^{12}$ cm$^{-2}$ and $3\times10^{13}$ cm$^{-2}$ and at an energy in a range between about 10 KeV and 300 KeV.

\* \* \* \* \*